（12）United States Patent
Bevilacqua et al.

(10) Patent No.: US 7,423,495 B2
(45) Date of Patent: Sep. 9, 2008

(54) OSCILLATOR AND METHOD FOR GENERATING AN OSCILLATOR SIGNAL

(75) Inventors: Andrea Bevilacqua, Vicenza (IT); Federico Pietro Pavan, Vicenza (IT); Christoph Sandner, Villach (AT)

(73) Assignee: Infineon Technologies AG, Munich (DE)

( * ) Notice: Subject to any disclaimer, the term of this patent is extended or adjusted under 35 U.S.C. 154(b) by 67 days.

(21) Appl. No.: 11/474,825

(22) Filed: Jun. 26, 2006

(65) Prior Publication Data

US 2008/0007366 A1 Jan. 10, 2008

(51) Int. Cl.
*H03B 5/00* (2006.01)
(52) U.S. Cl. .............................. 331/117 FE; 331/117 R; 331/179; 331/167
(58) Field of Classification Search ............. 331/117 R, 331/117 FE, 167, 179
See application file for complete search history.

(56) References Cited

U.S. PATENT DOCUMENTS 6,621,365 B1 9/2003 Hallivuori et al.
7,075,380 B2 * 7/2006 Singh et al. ............. 331/117 R

OTHER PUBLICATIONS

"A 1.8-GHz LC VCO With 1.3-GHz Tuning Range and Digital Amplitude Calibration", Axel D. Berny, Ali M. Niknejad and Robert G. Meyer, IEEE Journal of Solid-Stage Circuits, vol. 40, No. 40, Apr. 2005, pp. 909-917.
"Design of Wide-Band CMOS VCO for Multiband Wireless LAN Applications", Neric H. W. Fong, Jean-Olivier Plouchart, Noah Zamdmer, Duixian Liu, Lawrence F. Wagner, Calvin Plett and N. Garry Tarr, IEEE Journal of Solid-State Circuits, vol. 38, No. 8, Aug. 2003, pp. 1333-1342.
"A CMOS Fully Integrated 1 GHz and 2 GHz Dual Band VCO with a Voltage Controlled Inductor", Marc Tiebout, in Proceedings of the IEEE European Solid-State Circuits Conference, 2002, pp. 799-802.
"Demonstration of a Switched Resonator Concept in a Dual-Band Monolithic CMOS LC-Tuned VCO", Seong-Mo Yim and Kenneth K. O, in Proceedings of Custom Integrated Circuits Conference, 2001, 4 pgs.
"A Low-Noise Transformer-Based 1.7GHz CMOS VCO", Matt Straayer, Jose Cabanillas and Gabriel M. Rebeiz, IEEE ISSCC Digest of Technical Papers, San Francisco, CA, Feb. 2002, 8 pgs.
"80GHz CMOS Quadrature VCO Using Transformer-Based LC Tank", Donghyun Baek, Taeksang Song, Euisik Yoon and Songscheol Hong, IEEE Nicrowave and Wireless Component s Letters, vol. 13, No. 10, Oct. 2003, 3 pgs.

* cited by examiner

*Primary Examiner*—Arnold Kinkead
(74) *Attorney, Agent, or Firm*—Eschweiler & Associates, LLC

(57) ABSTRACT

An oscillator includes a first resonator circuit, a second resonator circuit coupled to the first resonator circuit and a reconfigurable network having a transconductance and coupled to at least one of the resonator circuits. Reconfiguration of the reconfigurable network with respect to the transconductance allows selection of one of multiple oscillation modes of the oscillator.

35 Claims, 4 Drawing Sheets

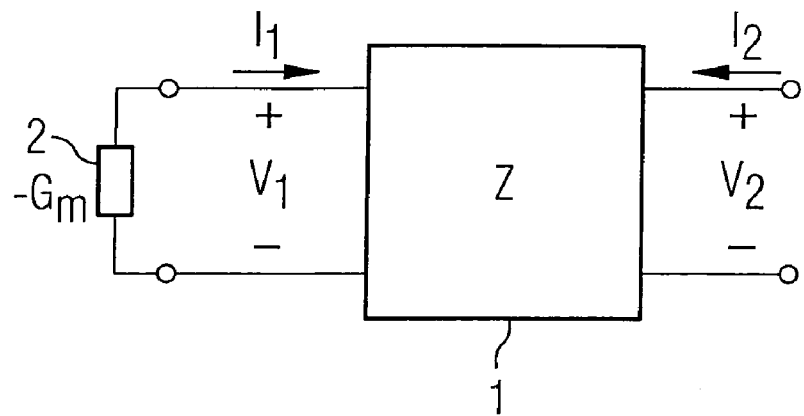
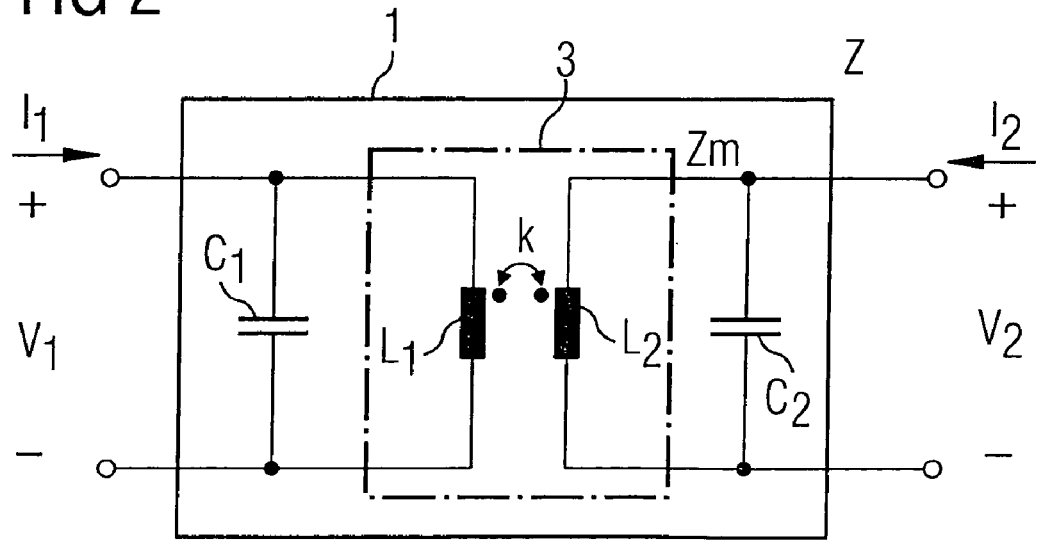

US 7,423,495 B2

OSCILLATOR AND METHOD FOR GENERATING AN OSCILLATOR SIGNAL

FIELD OF THE INVENTION

The invention relates to an oscillator, and in particular to a transformer-based LC tunable multimode oscillator. More specifically, the invention relates to enhancing the tuning capabilities of a voltage controlled oscillator (VCO) by providing means for changing the oscillation frequency without varying the value of the capacitance in the resonator.

BACKGROUND OF THE INVENTION

Typically, tuning of a VCO is achieved by changing the capacitance of the LC resonator tank. In order to obtain a wide tuning range, several techniques are used. Metal-oxide-semiconductor (MOS) varactors support a large capacitance variation, and have high tuning sensitivity and low phase noise performance. Switched capacitor banks have resistive and capacitive parasitics associated with the switches. Further, inductor switching has been proposed, although this technique is limited by the use of the switches.

Further, it has been proposed to employ a transformer-based resonator. A transformer-based resonator features two different modes of oscillation and thus provides for a wider frequency range. Switching between two modes of oscillation is accomplished by closing a switch in the second resonator circuit causing the second resonator circuit to be inductively coupled to the first resonator circuit. This changes the overall inductive impedance seen at the first resonator circuit resulting in a shift of the resonance frequency of the first resonator circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

An oscillator circuit is disclosed. In one embodiment of the invention, the oscillator comprises a transformer-based LC tunable multimode oscillator. The oscillator comprises a resonator circuit that is configured to operate in two different modes by switching a transconductance from a first port to a second port. Such switching results in a change in resonator design parameters.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, how-ever, of but a few of the various ways in which the principles of the invention may be employed. Other objects, advantages and novel features of the invention will be-come apparent from the following detailed description of the invention when considered in conjunction with the drawings.

BRIEF DESCRIPTION OF THE DRAWINGS

Aspects of the invention are made more evident in the following detailed description of some embodiments, when read in conjunction with the attached drawing figures, wherein:

FIG. 1 is a block diagram of a one-port oscillator representing an embodiment of the invention;

FIG. 2 is a schematic diagram of a transformer-based resonator comprising two coupled resonator circuits;

DETAILED DESCRIPTION OF THE INVENTION

Figure 3:
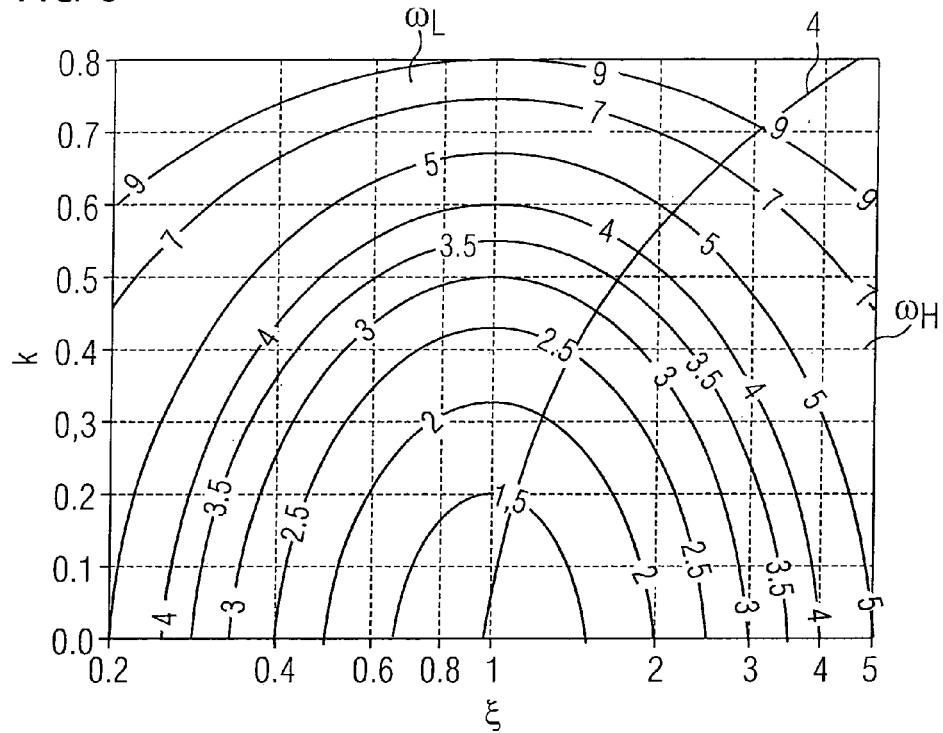
FIG. 3 is a contour diagram representing the tuning range of the oscillator according to the embodiment as a function of resonator design parameters k and $\xi$.

In the following description and claims, the terms "coupled" and "connected", along with derivatives such as "magnetically coupled" may be used. It should be understood that these terms may be used to indicate that two elements co-operate or interact with each other regardless whether they are in direct physical or electrical contact, or they are not in direct contact with each other.

Furthermore, it should be understood that embodiments of the invention may be implemented in discrete circuits, partially integrated circuits or fully integrated circuits.

An embodiment of the invention is an oscillator which can be treated as a one-port device as depicted in FIG. 1. The oscillator comprises a two-port resonator 1 and a negative transconductance ($-G_m$) 2. The first port of the two-port resonator 1 is represented by a voltage $V_1$ and a current $I_1$, the second port of the two-port resonator 1 is represented by a voltage $V_2$ and a current $I_2$. The transconductance 2 is connected to one (here: the first) port of the two-port resonator 1. The negative transconductance 2 turns the two-port resonator (passive device) into a one-port oscillator (active device) by restoring the energy dissipated at each cycle of oscillation.

Referring to FIG. 2 the two-port resonator 1 comprises a first resonator circuit connected to the first port and a second resonator circuit connected to the second port. The two resonator circuits may be implemented with two magnetically coupled LC resonators. The first resonator circuit comprises coil $L_1$ loaded by capacitor $C_1$ and the second resonator circuit comprises coil $L_2$ loaded by capacitor $C_2$. In this example, the two-port resonator 1 is a transformer-based resonator. However, alternative implementations are possible. The two-port resonator 1 may use capacitive coupling between the first and the second resonator circuits, and the first and the second resonator circuits may be of different type as the LC-resonator circuits depicted in FIG. 2.

The transformer 3 comprising two magnetically coupled coils with inductances $L_1$ and $L_2$ is described by means of the impedance matrix $$Z_m = \begin{bmatrix} R_1 + j\omega L_1 & j\omega k\sqrt{L_1 L_2} \\ j\omega k\sqrt{L_1 L_2} & R_2 + j\omega L_2 \end{bmatrix} \quad (1)$$

where ω denotes the frequency, k denotes the magnetic coupling coefficient and where the losses in the resonator circuits are modeled by means of the resistances $R_1$ and $R_2$.

The two-port transformer-based resonator 1 can be described by means of the impedance matrix $$Z = \frac{1}{1 - \omega^2 C_1 C_2 \det Z_m + j\omega(C_1 Z_{m11} + C_2 Z_{m22})} \cdot \begin{bmatrix} Z_{m11} + j\omega C_2 \det Z_m & Z_{m12} \\ Z_{m12} & Z_{m22} + j\omega C_1 \det Z_m \end{bmatrix}. \quad (2)$$

The use of a transformer in a resonator entails the possibility to achieve a better phase noise performance compared to a standard LC tank because of the intrinsic higher frequency selectivity. In addition, it allows the possibility of having two modes of oscillation, as explained in the following.

Returning to FIG. 1, it can be shown that the one-port oscillator may be excited in either of two modes of operation. Only two parameters, namely the magnetic coupling k and the ratio $\xi=(L_2 C_2)/(L_1 C_1)$ determine which oscillation mode is excited. The two possible modes of oscillation at frequencies $\omega_L$ and $\omega_H$ can be expressed as $$\omega_{L,H}^2 = \frac{1 + \xi \pm \sqrt{(1+\xi)^2 - 4\xi(1-k^2)}}{2(1-k^2)} \omega_2^2 \quad (3)$$

where $\omega_1^2 = (L_1 C_1)^{-1}$ and $\omega_2^2 = (L_2 C_2)^{-1}$. It can be shown that $$\omega_L \geq \{\omega_1, \omega_2\} \geq \omega_H. \quad (4)$$

FIG. 3 illustrates a contour diagram of the tuning range $TR=(\omega_H/\omega_L)^2$ as a function of $\xi=(\omega_1/\omega_2)^2$ and the magnetic coupling k. The area left from the mode separation line 4 corresponds to an oscillation that builds up at $\omega_L$ whereas the area right from the mode separation line 4 corresponds to an oscillation that builds up at $\omega_H$.

Commutating the negative transconductance $-G_m$ from the first port to the second port of the resonator 1 transfers the resonator design parameters $(\xi, k)$ into $(\xi^{-1}, k)$. According to FIG. 3, for many pairs of design parameter $(\xi, k)$, this will switch the one-port oscillator from one oscillator mode into the other oscillator mode. This means that the one-port oscillator depicted in FIG. 1 can be designed such that it oscillates at $\omega_H$ if the first port (second port) is terminated on $-G_m$, and it oscillates at $\omega_L$ if the termination is moved to the second port (first port).

Figure 4:
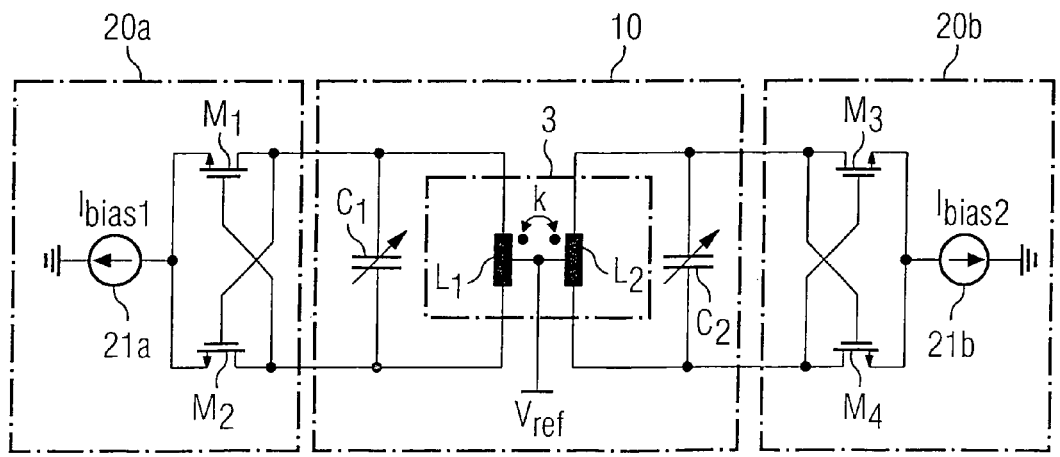
FIG. 4 is a schematic diagram of an implementation of a VCO according to the embodiment of the invention.

FIG. 4 illustrates an exemplary, simplified schematic of a dual-mode wideband VCO designed as a one-port configuration according to the principles illustrated in FIG. 1. The resonator 10 corresponds to the resonator 1 shown in FIG. 2. The resonator 10 may employ capacitors $C_1$ and $C_2$ with variable capacitances. Center taps of coils $L_1$ and $L_2$ are connected to a reference voltage $V_{ref}$. Reference voltage $V_{ref}$ may be a supply voltage or any bias voltage available. The first port of the resonator 10 is connected to negative transconductance 20a and the second port of the resonator 10 is connected to negative transconductance 20b.

Negative transconductance 20a comprises a current source 21a for generating a current $I_{bias1}$. The negative transconductance 20a is connected between ground (or any reference voltage different from $V_{ref}$) and a cross-coupled pair made of NMOS transistors $M_1$, $M_2$. The configuration of the negative transconductance 20b may be identical to negative transconductance 20a, using NMOS transistors $M_3$, $M_4$ for the cross-coupled pair and a current source 21b for generating a current $I_{bias2}$.

The higher-frequency mode of operation is started by enabling the current source 21a, thus activating the negative transconductance 20a feeding the first port of the resonator 1. In this mode of operation, the current source 21b and thus the negative transconductance 20b are disabled. Nevertheless, it is to be noted that the second resonator circuit established by $L_2$ and $C_2$ constitutes a closed circuit through which current is always allowed to flow and which, even if the negative transconductance 20b is powered-down (i.e. disabled), interacts via the magnetic coupling k with the first resonator circuit $L_1 C_1$. The higher-frequency mode of operation is switched into a lower frequency mode of operation by switching the current source 21a off and switching the current source 21b on. Thus, the negative transconductance 20a is turned off and the negative transconductance 20b is turned on. This effectively corresponds to commutating the negative transconductance 2 in FIG. 1 from the first port to the second port. From FIG. 3 it can be seen that transferring $(\xi, k)$ into $(\xi^{-1}, k)$ caused by the commutation of the primary/secondary terminations of the resonator 1 will in many cases switch the oscillation mode from $\omega_H$ to $\omega_L$.

Figure 5:
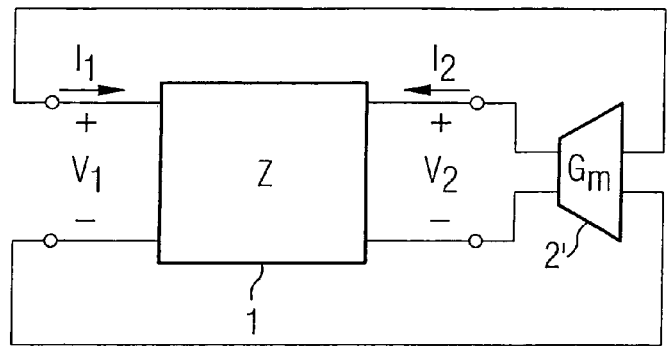
FIG. 5 is a block diagram of a two-port oscillator representing another embodiment of the invention.

Another embodiment of the invention is an oscillator which can be treated as a two-port device as depicted in FIG. 5. The two-port oscillator comprises the two-port resonator 1 and a transconductance $(\pm G_m)$ 2'. The transconductance 2' is placed in a feedback loop. More specifically, as shown in FIG. 5, if the transconductance 2' is used to inject current $I_2$ into the second port of the transformer-based resonator 1, the first port of the transformer-based resonator 1 is used to control the transconductance 2'. Alternatively, the transconductance 2' may be employed to inject current $I_1$ into the first port of the transformer-based resonator 1. In this case the transconductance 2' is controlled by the voltage $V_2$ showing up at the second port of the resonator 1. In both cases, similar to the previous embodiment, at each cycle of oscillation, the transconductance 2' operates to restore the energy dissipated in the resonator 1.

In the two-port configuration as illustrated in FIG. 5, oscillations build-up in the higher-frequency mode $\omega_H$ if the transconductance 2' has a positive transconductance value $G_m$ (i.e. forming a negative feedback loop together with the resonator 1). Thus, contrary to the one-port oscillator configuration shown in FIG. 1, the higher-frequency mode $\omega_H$ is established independent from the resonator parameters $(\xi, k)$. Conversely, if the transconductance 2' assumes a negative value $-G_m$, i.e. a positive feedback loop is established, the two-port oscillator will oscillate in the lower-frequency mode $\omega_L$, irrespective of the resonator parameters $(\xi, k)$. Thus, changing the transconductance value $G_m$ of the transconductance 2' from a negative (positive) to a positive (negative) value causes the two-port oscillator to pass from one mode of oscillation into the other mode of oscillation. It is to be noted that the modes of oscillation are the same for the one-port and for the two-port oscillator, i.e. equations (3) and (4) also apply for the two-port oscillator configuration.

Figure 6:
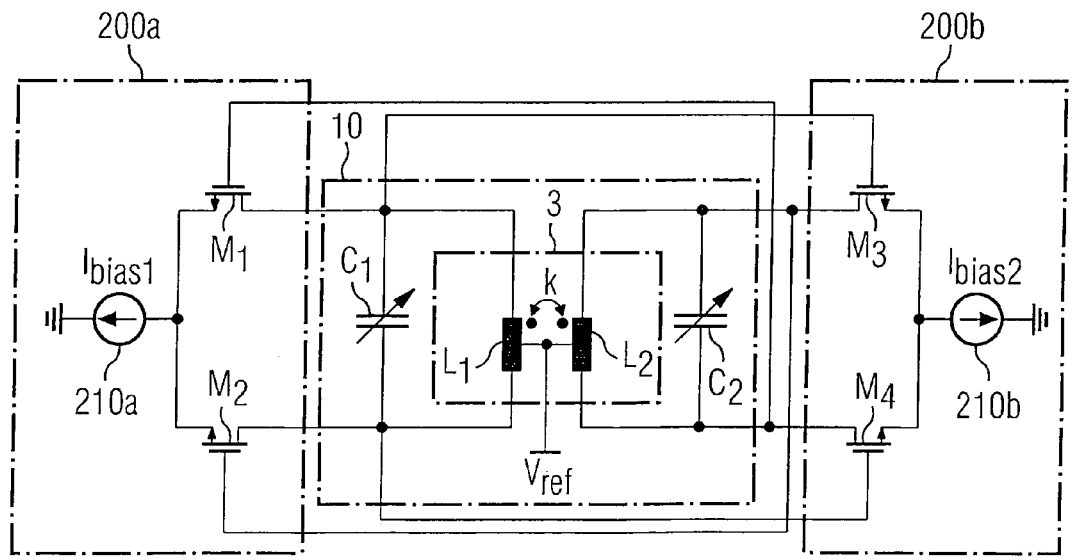
FIG. 6 is a schematic diagram of an implementation of a VCO according to the other embodiment of the invention.

FIG. 6 illustrates an exemplary, simplified schematic of a dual-mode wideband VCO designed as a two-port configuration according to the principles illustrated in FIG. 5. The resonator 10 may be identical to the resonator 10 shown in FIG. 4. The first port of the resonator 10 is connected to transconductance 200a of a negative transconductance value and the second port of the resonator 10 is connected to transconductance 200b of a positive transconductance value.

Transconductance 200a comprises a current source 210a for generating a current $I_{bias1}$ connected between ground (or any reference voltage different from $V_{ref}$) and a differential pair made of NMOS transistors $M_1$, $M_2$. The configuration of the transconductance 200b, in this respect, may be identical to transconductance 200a, using NMOS transistors $M_3$, $M_4$ for the differential pair and a current source 210b for generating a current $I_{bias2}$.

The differential pair $M_1$, $M_2$ of transconductance 200a is cross connected to the second port, i.e. the gate of transistor $M_1$ is coupled to the drain of transistor $M_4$ and the gate of transistor $M_2$ is coupled to the drain of transistor $M_3$. Furthermore, the gate of transistor $M_3$ is coupled to the drain of transistor $M_1$ and the gate of transistor $M_4$ is coupled to the drain of transistor $M_2$.

As a negative value of transconductance causes the two-port oscillator to oscillate in the lower oscillation mode $\omega_L$ and a positive value of transconductance causes the two-port oscillator to operate in the higher oscillation mode $\omega_H$, switching between these two modes may be performed by starting operation with enabled current source 210a and disabled current source 210b and then switching the current source 210a off and switching the current source 210b on. As the switching-off of the current sources 210a and 210b is performed without opening or closing any switches within the resonator circuits $L_1C_1$ and $L_2C_2$, mode switching does not impair the quality factor Q of the oscillator. In the two-port oscillator configuration, one port (in FIG. 5 the first port) is used to sense the voltage and the other port (in FIG. 5 the second port) is used to inject the current. As illustrated in FIG. 6, different voltage-sensing ports and different current injection ports may be used for the two oscillation modes of operation. On the other hand, it is also possible to use the same voltage-sensing port and the same current-injection port for both oscillation modes of operation. For instance, if the first port has to be the voltage-sensing port for both modes and the second port has to be the current-injection port for both modes, the transconductance 200a is removed from the first port and added to the second port (in parallel to transconductance 200b), whereby the differential pair $M_1$, $M_2$ is cross connected to the second port. Vice versa, the second port may be used as the voltage sensing port and the first port may be used as the current-injection port for both oscillation modes. In this case, both differential pairs $M_1$, $M_2$ and $M_3$, $M_4$ are on the first port's side and $M_3$, $M_4$ would be cross connected to the second port. Again, oscillation mode switching is accomplished by alternately activating and deactivating the two current sources 210a, 210b.

Figure 7:
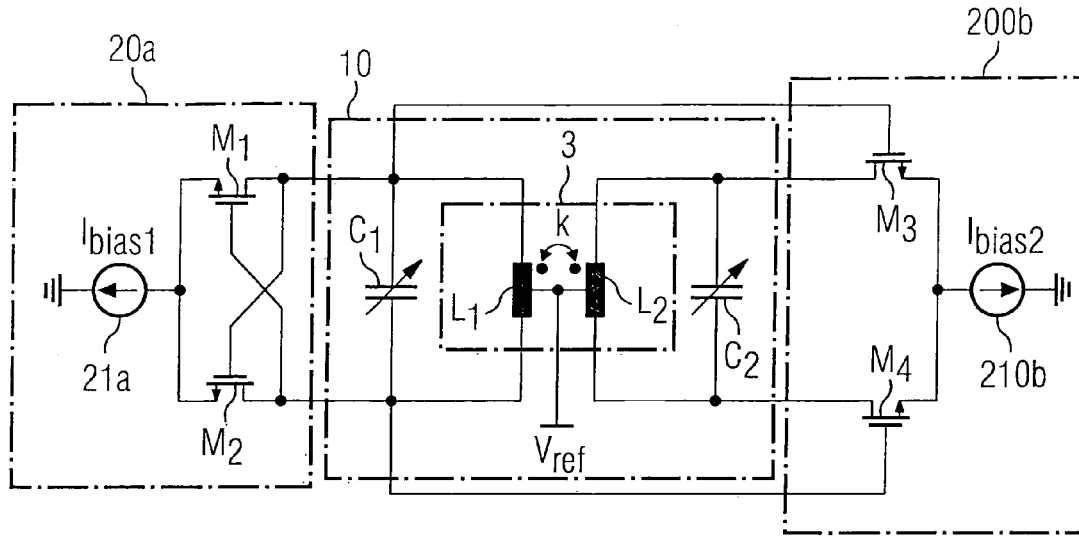
FIG. 7 is a schematic diagram of a preferred implementation of a VCO according to a hybrid of two embodiments of the invention.

FIG. 7 illustrates a "hybrid" implementation using the one-port oscillator configuration (FIG. 1) for one mode of oscillation and the two-port oscillator configuration (FIG. 5) for the other mode of oscillation. More specifically, the first port of the resonator 10 is coupled to transconductance 20a with a negative transconductance value (cf. FIG. 4), whereas the second port of the resonator 10 is coupled to the transconductance 200b (cf. FIG. 6) with a positive transconductance value. As may be readily understood from the foregoing, the oscillator shown in FIG. 7 is operated in the lower-frequency mode $\omega_L$ exploiting the one-port configuration and is operated in the higher frequency mode $\omega_H$ exploiting the two-port configuration. Again, the two modes are commutated by switching the current sources 21a and 210b alternatively on and off. Again, switching-off the current sources 21a, 210b does not affect the quality factor Q of the resonator. The "hybrid" implementation of FIG. 7 has a slightly better phase noise performance of the one-port configuration in the lower-frequency mode compared to the two-port configuration.

Thus, in the embodiments, all modes of a multi-mode (multi-resonance) resonator can be separately excited and selected by choosing the proper feedback network and feedback connection in order to build a multi-mode oscillator.

In the figures, the output of the oscillator is omitted for the sake of clarity. Output terminals may either be connected to the first or second resonator circuit, i.e. across $C_1$ or across $C_2$. Typically, the resonator side with the higher voltage swing will be selected. The output terminals may be directly connected to a load or buffers may be used in between.

Further, instead of using NMOS transistors, transconductances may also be realized by PMOS differential pairs and/or cross-coupled pairs. Also, more complicated transconductances as illustrated in the Figures may be used.

Variable capacitances $C_1$ and $C_2$ may be used in the embodiments and may be implemented by varactors and/or switched capacitor arrays. As a consequence, the invention is particularly suited to higher-frequency operation where capacitive parasitics limit the achievable tuning range. Moreover, for a given tuning range, the possibility of shrinking the range of capacitance variation allows to use larger inductances $L_1$, $L_2$ resulting in lower phase noise and power consumption. Another feature of the embodiments is dual-band operation, namely those applications where two disjoint tuning bands are needed. While it is straight forward to use the proposed dual-mode technique to achieve a given tuning range centered around two arbitrary center frequencies, the use of any conventional technique would entail a coarse tuning/fine tuning approach, possibly leading to large capacitive parasitics, reduced tuning range and/or degraded phase noise performance, especially at higher frequencies of operation. Capacitance $C_1$ or capacitance $C_2$ or both may also have fixed values.

Further, as previously explained, the VCO operation is largely determined by parameters $\xi$ and k. As a consequence, for a given transformer, i.e. for a given set of $L_1$, $L_2$ and k, the frequencies of both modes of oscillation are scaled without changing $\omega_H/\omega_L$, nor affecting the VCO behavior, if the capacitances $C_1$ and $C_2$ are varied while keeping their ratio constant. The result is that, for a target overall tuning range $TR=\omega_{max}/\omega_{min}$, the required capacitance variation is only TR, as opposed to $TR^2$ in the conventional tuning approach based solely on varactors or switched capacitor arrays. In other words, the dual-mode operation expands the tuning range by a factor $\omega_H/\omega_L$.

The transformer parameters ($\xi$, k) may be chosen based on the optimization of the quality factor Q for both oscillation modes of operation. For a balanced design, $\xi$ may be chosen close to 1, while maximizing k. In this case, the higher frequency mode $\omega_H$ is obtained by means of the two-port oscillator configuration, while the lower-frequency mode $\omega_L$ may be obtained by either configuration.

The inductances $L_1$ and $L_2$ may be selected by keeping in mind that higher inductance means lower power consumption and phase noise, but also higher capacitive parasitics and reduced tuning range.

The capacitances $C_1$ and $C_2$ may be chosen to satisfy the choice of $\xi$ and to center the frequency range of interest.

As an example, k=0.4 and $\xi$=0.88 may be selected. The inductances may be selected to be $L_1$=2.6 nH and $L_2$=3.6 nH. Capacitance variation is obtained by combining a 3-bit binary weighted capacitor array and a MOS varactor. In this example, the VCO is implemented in a digital 0.13 μm CMOS technology according to the simplified "hybrid" schematic illustrated in FIG. 7.

Figure 8:
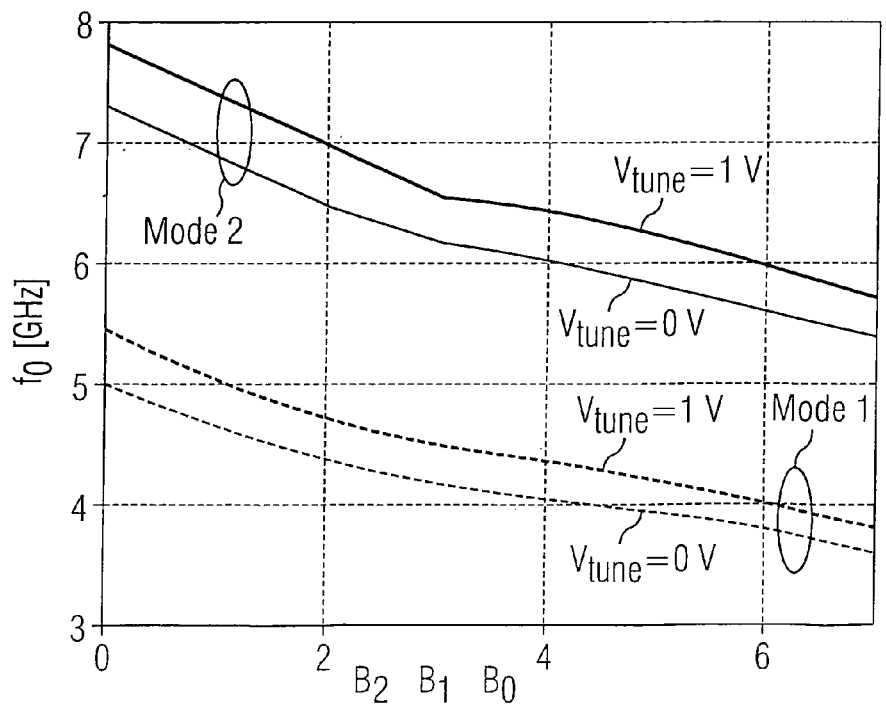
FIG. 8 is a diagram representing the simulated VCO frequency range versus a 3-bit control word of the VCO depicted in FIG. 7.

Referring to this example, FIG. 8 shows the simulated VCO frequency range versus a 3-bit control word $B_2B_1B_0$ of the capacitor bank. $V_{tune}$ is the varactor control voltage. Modes 1 and 2 are the lower frequency $\omega_L$ and higher frequency $\omega_H$ modes of operation, respectively. The VCO is capable of continuous tuning from 3.6 GHz to 7.8 GHz, although the capacitance variation alone would only cover a tuning range equal to $TR^{1/2}$.

While the invention has been illustrated and de-scribed with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the ex-tent that the terms "including", "includes", "having", "has", "with", or variants thereof are used in either the detailed description and the claims, such terms are in-tended to be inclusive in a manner similar to the term "comprising".

What is claimed is:

1. An oscillator, comprising:
   a first resonator circuit;
   a second resonator circuit coupled to the first resonator circuit; and
   a reconfigurable network comprising a first transconductance selectively coupled to at least one of the resonator circuits, and configured to reconfigure with respect to the first transconductance, thereby causing a change in an oscillation mode of the oscillator.

2. The oscillator of claim 1, wherein the network further comprises a selection circuit configured to connect the first transconductance to the first resonator circuit or to the second resonator circuit based on a desired oscillation mode.

3. The oscillator of claim 1, wherein the reconfiguration of the network comprises changing a sign of the first transconductance.

4. The oscillator of claim 1, wherein the first transconductance is connected to the first resonator circuit, further comprising:
   a second transconductance connected to the second resonator circuit, and wherein the reconfiguration of the network comprises selectively activating one of the first transconductance or the second transconductance.

5. The oscillator of claim 1, wherein the first transconductance is connected to the first resonator circuit, further comprising:
   a second transconductance connected to the second resonator circuit, and wherein one of the first or second transconductances is controlled by a control signal supplied from the second resonator circuit or the first resonator circuit, respectively.

6. The oscillator of claim 5, wherein the network further comprises a selection circuit configured to activate one of the first or the second transconductance.

7. The oscillator according to claim 1, wherein the first transconductance is connected to the first resonator circuit, further comprising:
   a second transconductance connected to the second resonator circuit, wherein the first transconductance is controlled by a control signal supplied from the second resonator circuit and the second transconductance is controlled by a control signal supplied from the first resonator circuit.

8. The oscillator of claim 7, wherein the network further comprises a selection circuit configured to activate one of the first or the second transconductance.

9. The oscillator of claim 1, wherein the first resonator circuit or the second resonator circuit, or both resonator circuits, are tunable.

10. The oscillator of claim 1, wherein at least one of the resonator circuits comprises a LC circuit.

11. An LC-oscillator, comprising:
    a first LC resonator circuit;
    a second LC resonator circuit coupled to the first LC resonator circuit; and
    a reconfigurable network comprising a first transconductance selectively coupled to at least one of the resonator circuits, and configured to selectively reconfigure itself to select one of multiple oscillation modes of the oscillator, whereby reconfiguration of the reconfigurable network is accomplished without operating any switches in the LC resonator circuits.

12. The LC-oscillator of claim 11, wherein the first transconductance is connected to the first LC resonator circuit, and the reconfigurable network further comprises a second transconductance connected to the second LC resonator circuit, wherein the network is configured to selectively activate one of the first or the second transconductance.

13. The LC-oscillator of claim 11, wherein the first transconductance is connected to the first LC resonator circuit and the reconfigurable network further comprises a second transconductance connected to the second LC resonator circuit, wherein one of the first or second transconductances is controlled by a control signal supplied from the second resonator circuit or the first resonator circuit, respectively.

14. The LC-oscillator of claim 13, wherein the network further comprises a selection circuit configured to activate one of the first or the second transconductance.

15. The LC-oscillator of claim 11, wherein the first transconductance is connected to the first LC resonator circuit and the reconfigurable network further comprises a second transconductance connected to the second LC resonator circuit, wherein the first transconductance is controlled by a control signal supplied from the second LC resonator circuit and the second transconductance is controlled by a control signal supplied from the first LC resonator circuit.

16. The LC-oscillator of claim 15, wherein the network further comprises a selection circuit configured to activate one of the first or the second transconductance.

17. The LC-oscillator of claim 11, wherein the first LC resonator circuit or the second LC resonator circuit, or both LC resonator circuits, are tunable.

18. An oscillator, comprising:
    a first resonator circuit;
    a second resonator circuit coupled to the first resonator circuit;
    a first transconductance coupled to the first resonator circuit;
    a second transconductance coupled to the second resonator circuit; and selection means for selectively activating or deactivating the first transconductance, the second transconductance, or both.

19. The oscillator of claim 18, wherein the first resonator circuit or the second resonator circuit, or both resonator circuits, are tunable.

20. The oscillator of claim 18, wherein at least one of the first and second resonator circuits comprises a LC resonator circuit.

21. An oscillator, comprising:
a first resonator circuit having a resonance frequency $\omega_1$;
a second resonator circuit having a resonance frequency $\omega_2$ and coupled to the first resonator circuit; and
a transconductance coupled to at least one of the first and second resonator circuits, wherein the oscillator is configured to operate based on a selective association of the transconductance with one of the first and second resonator circuit in at least two frequency modes $\omega_L$, $\omega_H$ with $\omega_L < \{\omega_1, \omega_2\} < \omega_H$.

22. A method for generating an oscillator signal, comprising:
operating a first resonator circuit;
operating a second resonator circuit coupled to the first resonator circuit; and
selectively reconfiguring a reconfigurable network coupled to at least one of the first and second resonator circuits, and comprising a first transconductance, wherein the selective reconfiguration of the reconfigurable network is with respect to the first transconductance and allows selection of one of multiple oscillation modes of the oscillator.

23. The method of claim 22, further comprising:
selecting the oscillation mode by connecting the first transconductance to the first resonator circuit or to the second resonator circuit.

24. The method of claim 22, further comprising:
selecting the oscillation mode by changing a sign of the transconductance.

25. The method of claim 22, wherein the first transconductance is connected to the first resonator circuit and the reconfigurable network further comprises a second transconductance connected to the second resonator circuit, the method further comprising:
selecting the oscillation mode by activating one of the first transconductance or the second transconductance.

26. The method of claim 22, wherein the first transconductance is connected to the first resonator circuit and the reconfigurable network further comprises a second transconductance connected to the second resonator circuit, the method further comprising at least one of:
controlling the first transconductance by a control signal supplied from the second resonator circuit; and
controlling the second transconductance by a control signal supplied from the first resonator circuit.

27. The method of claim 26, further comprising:
selecting the oscillation mode by activating the first transconductance or the second transconductance.

28. The method of claim 27, further comprising:
tuning the first resonator circuit or the second resonator circuit, or both resonator circuits.

29. A method for generating an oscillator signal in an oscillator comprising first and second resonator circuits operably coupled together, comprising:
selectively activating a first transconductance coupled to a first resonator circuit; and
selectively activating a second transconductance coupled to a second resonator circuit.

30. The oscillator of claim 1, wherein the reconfigurable network is external to the at least one of the resonator circuits.

31. The LC-oscillator of claim 11, wherein the reconfigurable network is external to the at least one of the resonator circuits.

32. The oscillator of claim 18, wherein at least one of the transconductances is external to its corresponding resonator circuit.

33. The oscillator of claim 21, wherein the transconductance is external to the at least one of the resonator circuits.

34. The method of claim 22, wherein the reconfigurable network is external to the at least one of the resonator circuits.

35. The method of claim 29, wherein at least one of the transconductances is external to its corresponding resonator circuit.

* * * * *